US012596164B2

(12) United States Patent
von Deuster et al.

(10) Patent No.: US 12,596,164 B2
(45) Date of Patent: Apr. 7, 2026

(54) METHOD AND SYSTEM FOR IMPROVING IMAGE CONTRAST IN FAST DRIVEN EQUILIBRIUM INVERSION RECOVERY IMAGING

(71) Applicants: Siemens Healthcare GmbH, Erlangen (DE); Balgrist Campus AG, Zürich (CH)

(72) Inventors: Constantin von Deuster, Zürich (CH); Daniel Nanz, Hombrechtikon (CH)

(73) Assignees: Siemens Healthineers AG, Forchheim (DE); Balgrist Campus AG, Zürich (CH)

( * ) Notice: Subject to any disclaimer, the term of this patent is extended or adjusted under 35 U.S.C. 154(b) by 168 days.

(21) Appl. No.: 18/524,229

(22) Filed: Nov. 30, 2023

(65) Prior Publication Data

US 2024/0210507 A1 Jun. 27, 2024

(30) Foreign Application Priority Data

Dec. 23, 2022 (EP) .................................... 22216530

(51) Int. Cl.
　　*G01V 3/00* (2006.01)
　　*G01R 33/561* (2006.01)
(52) U.S. Cl.
　　CPC ................................ *G01R 33/5615* (2013.01)
(58) Field of Classification Search
　　CPC ................................................ G01R 33/5615
　　　　　　　　　(Continued)

(56) References Cited

U.S. PATENT DOCUMENTS 5,248,942 A 9/1993 Ratzel et al.
6,456,071 B1 * 9/2002 Hennig .............. G01R 33/5613
　　　　　　　　　(Continued)

FOREIGN PATENT DOCUMENTS

CN 101401723 A * 4/2009
CN 105259198 A 1/2016
　　　　　　　　　(Continued)

OTHER PUBLICATIONS

Melhem, Elias R. et al; "Cervical spine: three-dimensional fast spin-echo MR imaging-improved recovery of longitudinal magnetization with driven equilibrium pulse"; Radiology; vol. 218; No. 1; Date: Jan. 1, 2001; pp. 283-288; XP093050416.
　　　　　　　　　(Continued)

*Primary Examiner* — Walter L Lindsay, Jr.
*Assistant Examiner* — Frederick Wenderoth
(74) *Attorney, Agent, or Firm* — Laurence A. Greenberg; Werner H. Stemer; Ralph E. Locher

(57) ABSTRACT

A method and a magnetic resonance imaging (MRI) system improve an MRI signal from a magnetization of interest. The method includes performing an MRI pulse sequence containing three consecutive radio frequency (RF) elements, namely, a first element that is an inversion-recovery pulse sequence characterized by a time of inversion, a second element that is an image-encoding pulse sequence starting at the time of inversion with an excitation RF pulse followed by an image-encoding gradient and a data sampling. The second element is followed by a third element. An MRI signal generated by the object and sampled by image readout blocks applied to the object by the MRI system during each repetition time, is acquired. From the MRI signal, an image of the object is reconstructed. The third element is a modified driven-equilibrium (mDE) pulse sequence configured
　　　　　　　　　(Continued)

101　　　　100

106

Processor
102

Memory
103

Display
104

Biological Object for achieving a conversion of a transverse magnetization component.

11 Claims, 6 Drawing Sheets

(58) Field of Classification Search
USPC ......................................................... 324/307
See application file for complete search history.

(56) References Cited

U.S. PATENT DOCUMENTS

| | | | |
|---|---|---|---|
| 2015/0164368 A1 | 6/2015 | Werden | |
| 2018/0081016 A1 | 3/2018 | Carinci et al. | |
| 2021/0199741 A1 | 7/2021 | Amemiya et al. | |
| 2021/0199742 A1 | 7/2021 | Lyu et al. | |

FOREIGN PATENT DOCUMENTS

| | | | | |
|---|---|---|---|---|
| CN | 108363026 A | | 8/2018 | |
| EP | 1273922 A1 | * | 1/2003 | ........... A61B 5/1455 |
| EP | 3336570 A1 | * | 6/2018 | ......... G01R 33/5616 |
| JP | H11253417 A | * | 9/1999 | |
| JP | 2004166751 A | | 6/2004 | |
| JP | 2021104198 A | | 7/2021 | |
| WO | WO-2019241459 A1 | * | 12/2019 | ......... G01R 33/5602 |

OTHER PUBLICATIONS

Bydder, G. M. et al:"MRI: Use of the inversion recovery pulse sequence"; Clinical Radiology, Elsevier; Amsterdam; NL; vol. 53; No. Date Mar. 1, 1998; pp. 159-176; XP005426183; ISSN: 0009-9260;DOI:10.1016/S0009-9260(98)80096-2.

Bydder, G.M. et al:"MR imaging: clinical use of the inversion recovery sequence"; J Comput Assist Tomogr; vol. 9; No. 4; Date: Jul. 1, 1985; pp. 659-675; XP093050879.

Pravatä, E., et al., Dedicated 3D-T2-STIR-ZOOMit Imaging Improves Demyelinating Lesion Detection in the Anterior Visual Pathways of Patients with Multiple Sclerosis. American Journal of Neuroradiology, 2021. 42(6): p. 1061.

Becker, E.D., et al., Driven Equilibrium Fourier Transform Spectroscopy. A New Method for Nuclear Magnetic Resonance Signal Enhancement. Journal of the American Chemical Society, 1969. 91 (27): p. 7784-7785.

Waugh, J.S., Sensitivity in Fourier transform NMR spectroscopy of slowly relaxing systems. Journal of Molecular Spectroscopy, 1970. 35(2): p. 298-305.

Waldstein, P. et al . . . , Driven Equilibrium Methods for Enhancement of Nuclear Transients. Review of Scientific Instruments, 1971. 42(4): p. 437-440.

Wallace, W.E., Theory and Optimization of the Pulsed NMR Driven Equilibrium Technique. The Journal of Chemical, Physics, 1971. 54(3): p. 1425-1427.

Jones, D.E., Fourier transform nuclear magnetic resonance. II. Driven equilibrium fourier transform and spin-echo fourier transform. Journal of Magnetic Resonance (1969), 1972. 6(2): p. 183-190.

Van Uijen, C.M.J et al., Driven-equilibrium radiofrequency pulses in NMR imaging. Magnetic Resonance in Medicine, 1984. 1(4): p. 502-507.

* cited by examiner

METHOD AND SYSTEM FOR IMPROVING IMAGE CONTRAST IN FAST DRIVEN EQUILIBRIUM INVERSION RECOVERY IMAGING

CROSS-REFERENCE TO RELATED APPLICATION

This application claims the priority, under 35 U.S.C. § 119, of European Patent Application EP22216530.0, filed Dec. 23, 2022; the prior application is herewith incorporated by reference in its entirety.

FIELD AND BACKGROUND OF THE INVENTION

The present invention falls within the field of magnetic resonance imaging (MRI) systems and methods. In particular, the present invention relates to a method and system for improving image contrast in fast driven equilibrium inversion recovery imaging in MRI.

More specifically, the present invention tackles the problem of long acquisition times required for fluid-sensitive fast- or turbo-spin-echo-based (FSE or TSE) MRI with robust fat-signal suppression by short-tau inversion (short-TI) recovery (STIR, [1, 2]) preparation.

Central to the problem is the slow recovery of longitudinal fluid magnetization and, thus, the long-time it needs to regrow after a spectrally non-selective STIR-inversion preparation pulse and the radiofrequency (RF) pulses of a turbo-spin-echo readout. The characteristic recovery time, T1, of low-viscous fluids, is in the range of several seconds at the field strength of clinical scanners (e.g., 1.5 to 7 Tesla). In addition, there is also a still relatively long inversion-recovery time (TI) that has to be waited, after the application of the inversion pulse, for the fat magnetization to go through zero at the start of the imaging readout—even though the fat T1-time is comparatively short, e.g., some 380 ms at 3 Tesla.

In 2D sequences, the interleaved use of slice-selective inversion in one slice and imaging readout-trains in another slice can mitigate the issue. However, this is not possible in corresponding 3D acquisitions and, thus, these take too long to be in broad clinical use for fluid detection, e.g., of the musculoskeletal system. For instance, research reports demonstrate long scan times for imaging even a small anatomy with a reduced field of view and very short repetition times (TR) [3], most often targeting nerves, but not primarily a strong positive fluid contrast. Nevertheless, 3D STIR sequences could be valuable for evaluation of the musculoskeletal system, e.g., to assess inflammation around metallic implants in hip, knee, or shoulder joints.

At the moment, no adequate solution exists: 2D STIR acquisitions typically take relatively long and are acquired with lower spatial resolution than corresponding, e.g., proton-density weighting, PDw, TSE scans, and 3D STIR sequences take so long that they are most often not applied in standard clinical joint imaging—and only used for special applications, like MR neurography (nerve visualization) of the cervical or lumbar plexus, where the sensitivity, with which fluids can be detected is not the primary goal.

To enhance fluid signal in images acquired with short-TR sequences without an inversion-recovery preparation, it has also been proposed to accelerate the recovery of longitudinal fluid magnetization by means of a "driven-equilibrium", DE, pulse-sequence element. This technique was first implemented in NMR spectroscopy [4-9], and has then been also applied to MRI (see [9]). Such sequences involving a DE pulse-sequence element are also referred to by terms such as "fast-recovery fast spin-echo", "Restore-TSE", or "DRIVE" sequences. The basic idea is summarized in FIG. 3, wherein the top sequence representation A shows a basic TSE sequence, and the bottom sequence representation B shows a basic TSE sequence with a trailing "driven-equilibrium" pulse-sequence element. The fate of fluid (long T1, long T2—T2 being the transverse relaxation), tissue (intermediate T1, intermediate T2, e.g., muscle tissue), and fat (short T1, long "TSE-" T2) magnetizations through the course of the respective sequence is sketched below each sequence diagram. A significantly larger longitudinal fluid magnetization can be observed in the bottom sequence representation B at the end of a TR period (time points 5 in the bottom sequence representation B versus 4 in the top sequence representation A) before application of the next excitation pulse. This means, that it will give rise to a larger signal during the next TR period with the next TSE train. The magnitude enhancement is achieved by the driven-equilibrium element that refocuses remaining transverse magnetization at the end of the imaging echo train and converts it to longitudinal magnetization by means of a 90-degree "flip-back" pulse. The phase of this pulse should differ (by 180° ("-x")) from that of the initial excitation pulse if the phase of the refocusing pulses has a difference of 90 degrees ("+/-y") versus that of the initial excitation pulse ("+x"). The RF-pulses applied between time points 1 and 4 in the bottom sequence representation B can together be viewed as a composite 0-degree pulse for on-resonance magnetization with sufficiently long relaxation times, such as in low-viscous fluids. In the figures, the following abbreviations are used: Inv: inversion pulse, TI: time of inversion (recovery), Exc: excitation pulse, Ref: refocusing pulse, ES: echo spacing, Acq: acquisition, ET: echo train, ETL: echo-train length, eq: equilibrium, TF: turbo factor, $n_{PhE}$: number of phase-encoding steps, TR: repetition time.

Examples of images from 3D acquisitions with and without the DE element are shown then in FIG. 4, wherein the left image A, respectively the right image B, shows a 3D fast/turbo spin-echo image (TR/TE 211/60 ms) acquired without, respectively with, a driven-equilibrium pulse-sequence element appended to the imaging sequence. Despite the (for fluid-sensitive spin-echo sequences) short TR time (211 ms), a stronger signal and brighter appearance of the cerebrospinal fluid, CSF, is obtained in the right image B (see the arrowheads 41) compared to the left image A. It has to be pointed out that a bright subcutaneous fat signal can also be observed in the images obtained from these sequences without magnetization preparation. The images of FIG. 4 are from Ref. [10].

The situation is different in STIR imaging, which attempts to minimize fat signal and to highlight magnetization with long T1 (and, typically, also long T2) times, such as in low-viscous fluids. In this case, the imaging sequence is preceded by a 180-degree inversion pulse, followed by a recovery period, TI. The recovery time is tailored for the fastest relaxing fat-signal component (T1 of ca. 380 to 400 ms at a field strength of 3 Tesla) to reach its zero crossing, $TI_{zc}$ ($TI_{zc}=T1*\ln(2)=T1*0.693$, assuming a perfect 180-degree inversion pulse is applied when the longitudinal fat magnetization has reached its maximum value). In practice, shorter TI times are often chosen in STIR imaging to (i) speed up the acquisition, and (ii) to have some residual fat signal, e.g., of bone marrow, to help the reading of the images.

Since the fluid magnetization has a much longer T1 time than fat (in the range of one order of magnitude larger), it will be aligned along the negative z-axis at the time when the excitation pulse is applied—in case it also had a substantial magnitude along the positive z-axis before the application of the inversion pulse. Thus, a conventional DE element as shown in FIG. 3 will flip back the fluid magnetization into the negative z-axis and therefore even delay the recovery of longitudinal fluid magnetization. Thus, the longitudinal fluid-magnetization in the dynamic equilibrium will be smaller, which translates into an attenuated fluid signal—instead of an enhanced one.

This is shown in more details in FIG. 5, which schematically presents a basic STIR-TSE sequence with an unadjusted, i.e., state-of-the-art "driven-equilibrium" pulse-sequence element as shown in FIG. 3, bottom sequence representation B. Since fluid magnetization is aligned along the negative z-axis before the excitation pulse (time point 3) and the RF pulses between time points 3 and 6 act as a composite 0°-pulse, the fluid magnetization also ends up aligned with the negative z-axis at time point 6—far from its fully relaxed, maximum thermodynamic equilibrium value. For fluid magnetization, the RF-pulses applied between time points 1 and 6 approach a composite 180°-rotation, which, when repeated in succession with a sufficiently short TR, will result in small magnitude of fluid magnetization in the dynamic equilibrium. Instead of enhancing the fluid signal, the unmodified driven-equilibrium element, as shown in FIG. 5, actually reduces the intensity of the fluid signal.

SUMMARY OF THE INVENTION

While the above introduction focused on the problematic of fluid-sensitive images, the present invention lies in a more general context and aims to find a system and method capable of improving image contrast for a magnetization of interest while remaining suitable for clinical applications. In particular, the system and the method according to the invention shall be able to provide fluid-sensitive MRI images with improved contrast, being preferentially capable of attenuating or suppressing fat signal, and suitable for clinical applications. By suitable for clinical application, it has to be understood that the system and method they shall be able to shorten the imaging time while keeping a high signal intensity for the magnetization of interest (e.g. fluid magnetization).

The objective is achieved according to the present invention by a system and method for improving image contrast in fast driven equilibrium inversion recovery imaging, notably in multi echo imaging, according to the object of the independent claims. Dependent claims present further advantages of the invention.

The present invention concerns an MRI method for improving an MRI signal for a magnetization of interest, i.e. for improving image contrast for the magnetization of interest, when imaging an object placed in an examination volume of an MRI system, the method containing the steps of:

performing, by the MRI system, an MRI pulse sequence containing three consecutive radio frequency (RF) elements, namely, a first element that is an inversion-recovery pulse sequence characterized by a time of inversion (recovery) TI, a second element that is an image-encoding pulse sequence starting at the time of inversion TI with an excitation RF pulse followed by at least one image-encoding gradient and at least one data sampling. In particular, the data sampling contains a radial sampling of MRI signal at ultra-short echo time. Alternatively, the data sampling is a sampling of MRI signals occurring during a formation of one or multiple gradient echoes, or of one or multiple spin echoes, or of a combination of gradient and spin echoes. For instance, the excitation RF pulse can be followed by a refocusing RF pulse, imaging-encoding gradients, and data sampling. According to another example, the excitation RF pulse can be followed by a train of refocusing RF pulses, imaging encoding gradients and data samplings. The second element is then followed by a third element that is a modified driven-equilibrium (hereafter "mDE") pulse sequence configured for achieving a conversion of a transverse magnetization component of the magnetization of interest into positive longitudinal magnetization, aligned with the positive z-axis and the B0-field direction, that, in contrast, would be converted into negative longitudinal magnetization, aligned along the negative z-axis, opposed to the B0-field direction, by application of a traditional driven-equilibrium pulse sequence. In particular, the mDE pulse sequence according to the invention ends by a phase shifted flip-back pulse, the latter being characterized by a 90 degree flip angle and, preferentially, 90° phase shift (+x) relative to the refocusing pulse (+y), or non phase shifted relative to (i.e. identical phase as) the excitation RF pulse (+x), or 180° phase shift relative to in the art DE flip-back pulse (−x), wherein performing said MRI pulse sequence is cyclically repeated by the MRI system according to a repetition time TR. In other words, the mDE pulse sequence according to the invention is a phase shifted DE ("phase shifted" compared to known in the art DE) pulse sequence configured for converting remains of the transverse magnetization component of the magnetization of interest, notably fluid magnetization, which the inversion-recovery pulse sequence caused to exhibit a 180-degree phase shift—compared to the situation without inversion-recovery pulse sequence, into positive longitudinal magnetization in order to increase longitudinal magnetization before starting and applying a next of said MRI pulse sequence at said time of repetition TR after the first element, i.e. after the 180-degree inverting pulse of the inversion-recovery pulse sequence. Preferentially, the MRI pulse sequence according to the invention is a STIR-TSE or STIR-SE sequence followed by the modified driven-equilibrium pulse-sequence element containing the phase shifted flip-back pulse. Advantageously, compared to applying a known in the art DE pulse sequence after the second element (which would make the MRI pulse sequence acting as a 180-degree composite pulse), applying the mDE pulse sequence after the second element of the MRI pulse sequence makes the latter act as a composite 0-degree pulse on longitudinal magnetization of interest (i.e. on longitudinal magnetization component of the magnetization of interest), e.g. longitudinal fluid magnetization;

acquiring, by the MRI system, an MRI signal generated by the object and sampled by image readout blocks applied to the object by the MRI system during each repetition time TR. By acquiring an MRI signal, it has notably to be understood that MRI signal data sampled by the image readout blocks are collected for the purpose of image reconstruction. The MRI signal generated by the object contains notably the MRI signal generated by the magnetization of interest; and reconstructing, from the MRI signal, an image of the object.

The present invention concerns also an MRI system or apparatus configured for imaging a biological object and configured for carrying out the steps of the previously described method.

The foregoing has broadly outlined the features and technical advantages of the present disclosure so that those skilled in the art may better understand the detailed description that follows.

Additional features and advantages of the disclosure will be described hereinafter that form the object of the claims. Those skilled in the art will appreciate that they may readily use the concept and the specific embodiment disclosed as a basis for modifying or designing other structures for carrying out the same purposes of the present disclosure.

For a more complete understanding of the present disclosure, and the advantages thereof, reference is now made to the following descriptions taken in conjunction with the accompanying drawings, wherein like numbers designate like objects.

Other features which are considered as characteristic for the invention are set forth in the appended claims.

Although the invention is illustrated and described herein as embodied in a a method and a system for improving image contrast in fast driven equilibrium inversion recovery imaging, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
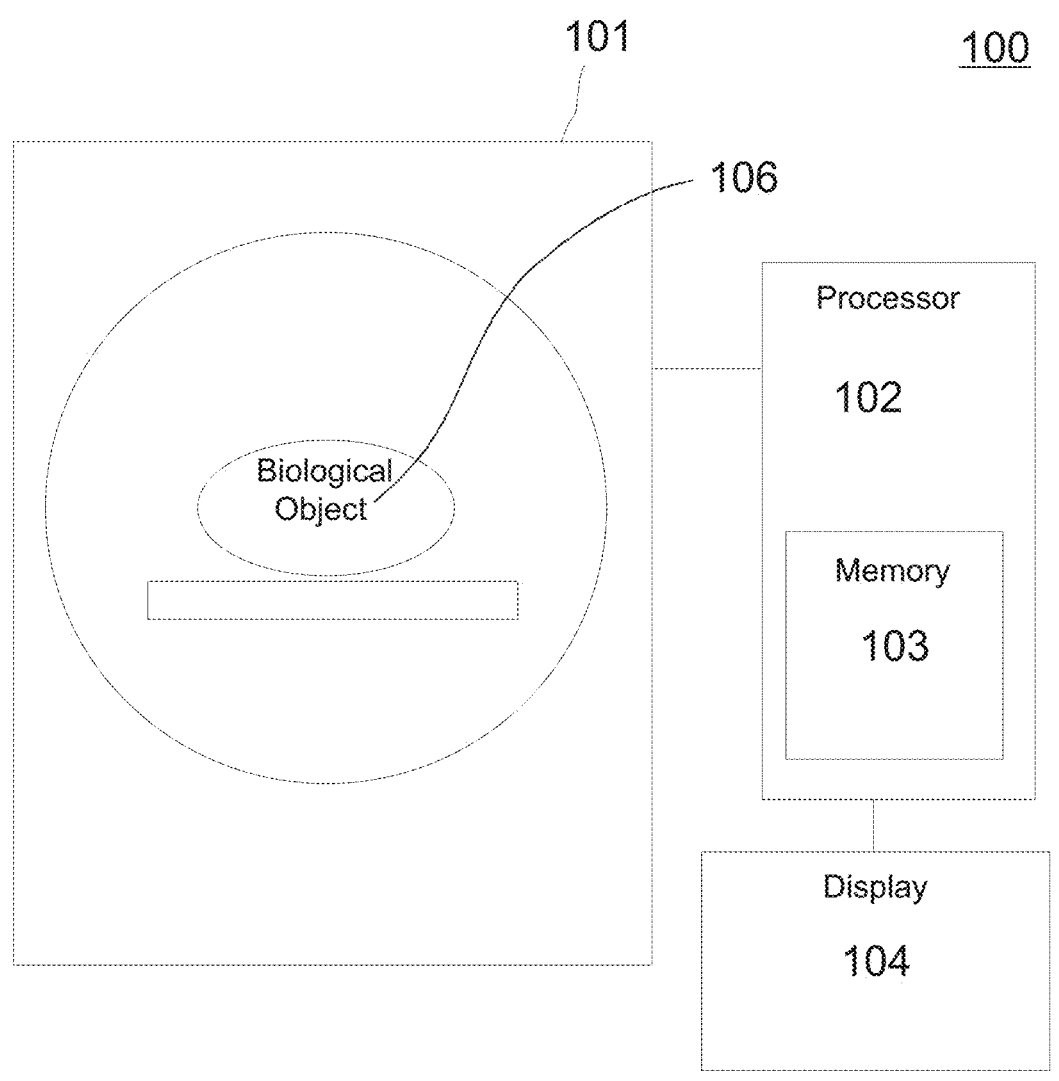
FIG. 1 is a schematic illustration of an MRI system according to the invention.
Figure 2:
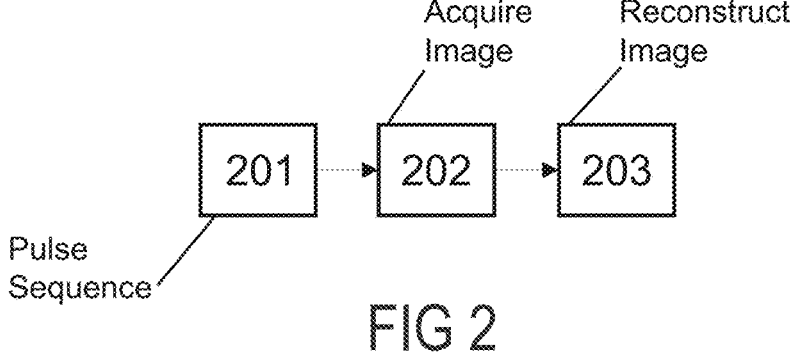
FIG. 2 is a flowchart illustrating a method according to the invention.

Referring now to the figures of the drawings in detail and first, particularly to FIG. 1 thereof, there is shown a preferred embodiment of an MRI system 100 according to the invention, i.e. that is capable of improving image contrast in fast driven equilibrium inversion recovery multi echo imaging, improving notably the suppression of fat-signal when implementing the method according to the invention. The MRI system 100 contains notably different coils 101 and respective coil controllers configured for generating magnetic fields and RF pulses in order to acquire an MRI signal from a biological object 106. For instance, the MRI system 100 contains:

an axial magnetic field coil and an axial magnetic field coil controller for controlling an axial magnetic field $B_0$ generated by the axial magnetic field coil;

a gradient coil and a gradient coil controller configured for controlling a magnetic field gradient G generated by the gradient coil;

a RF coil and a RF coil controller configured for controlling a RF magnetic field B1 produced by the RF coil;

a receiver coil, which can be the same as the RF coil, configured for detecting changes in a magnetization of the biological object 106 to be imaged, and for communicating the changes to a receiver coil controller, which can be the same as the RF coil controller, the latter outputting an MRI signal to a processing unit 102 containing a processor and a memory 103, the processing unit 102 being configured for processing the outputted MRI signal in order to reconstruct images of the biological object; and a display 104 for displaying the reconstructed images.

Figure 3:
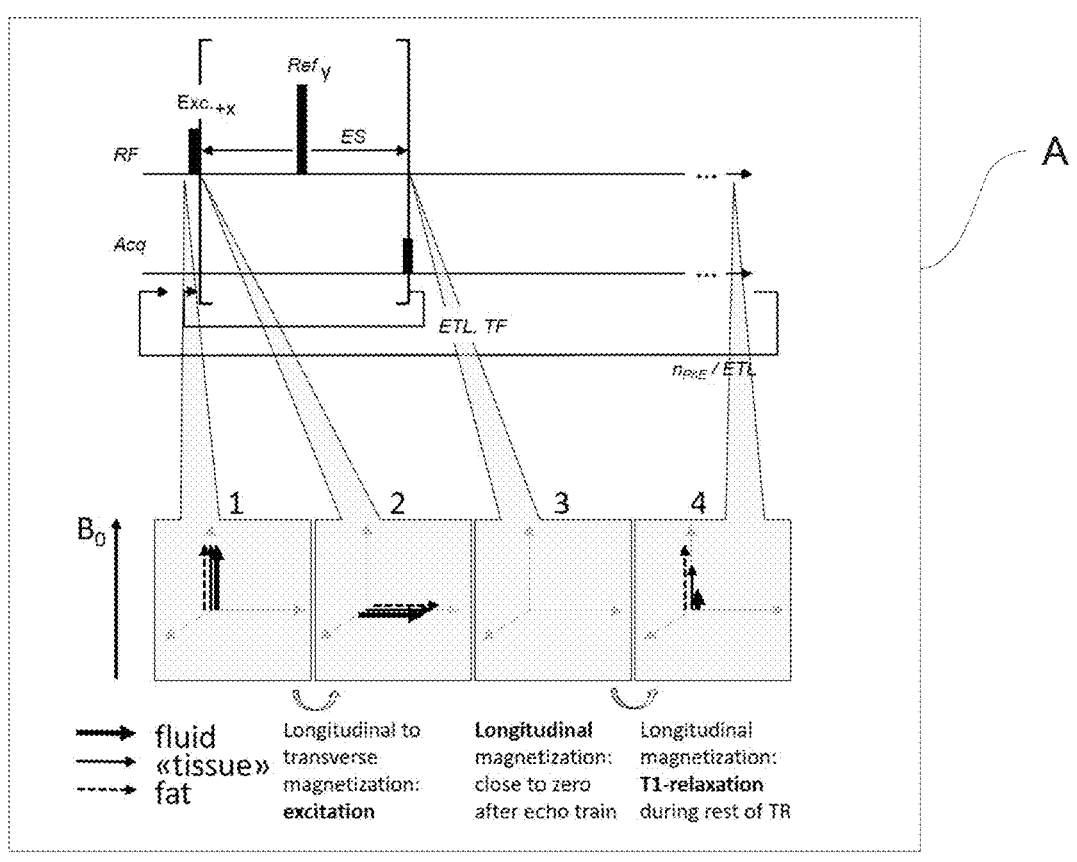
FIG. 3 is a schematic representation of a basic TSE sequence (top sequence representation A) and of a basic TSE sequence with a "driven equilibrium" pulse-sequence element (bottom sequence representation B)
Figure 3:
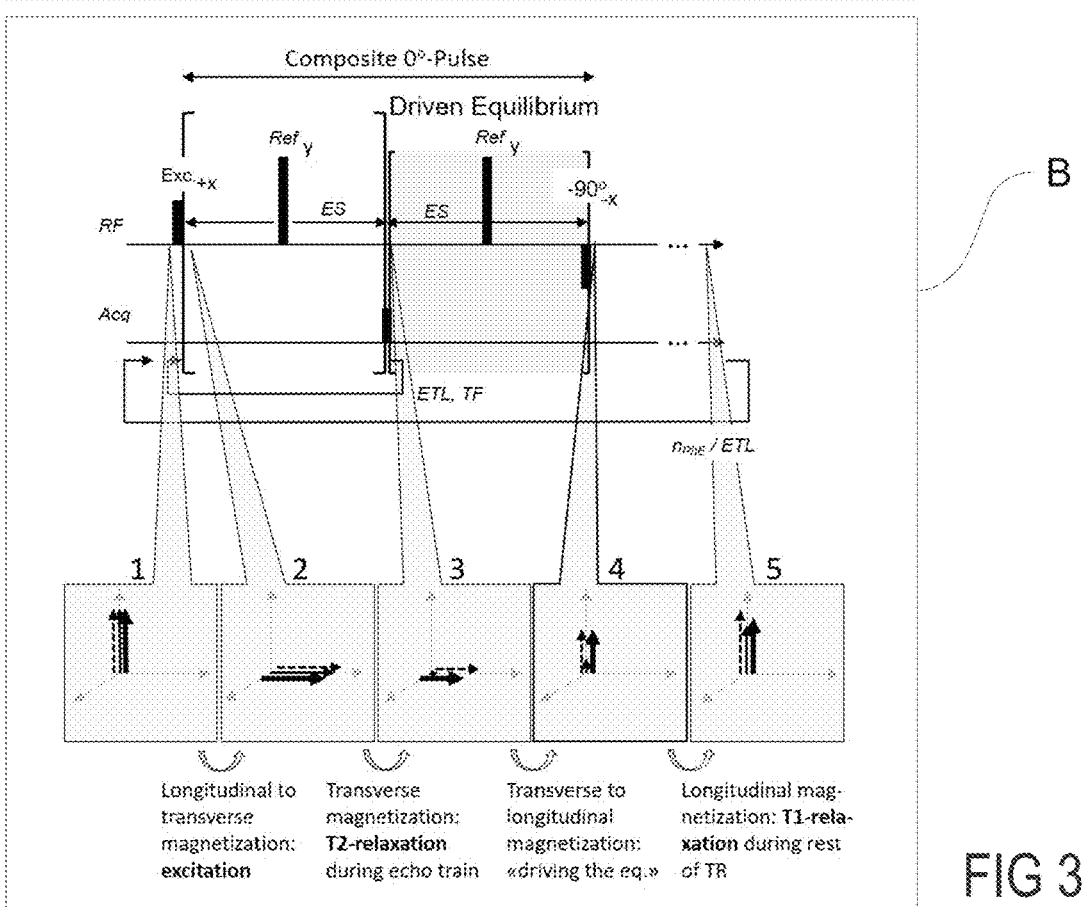
Figures 4, 5:
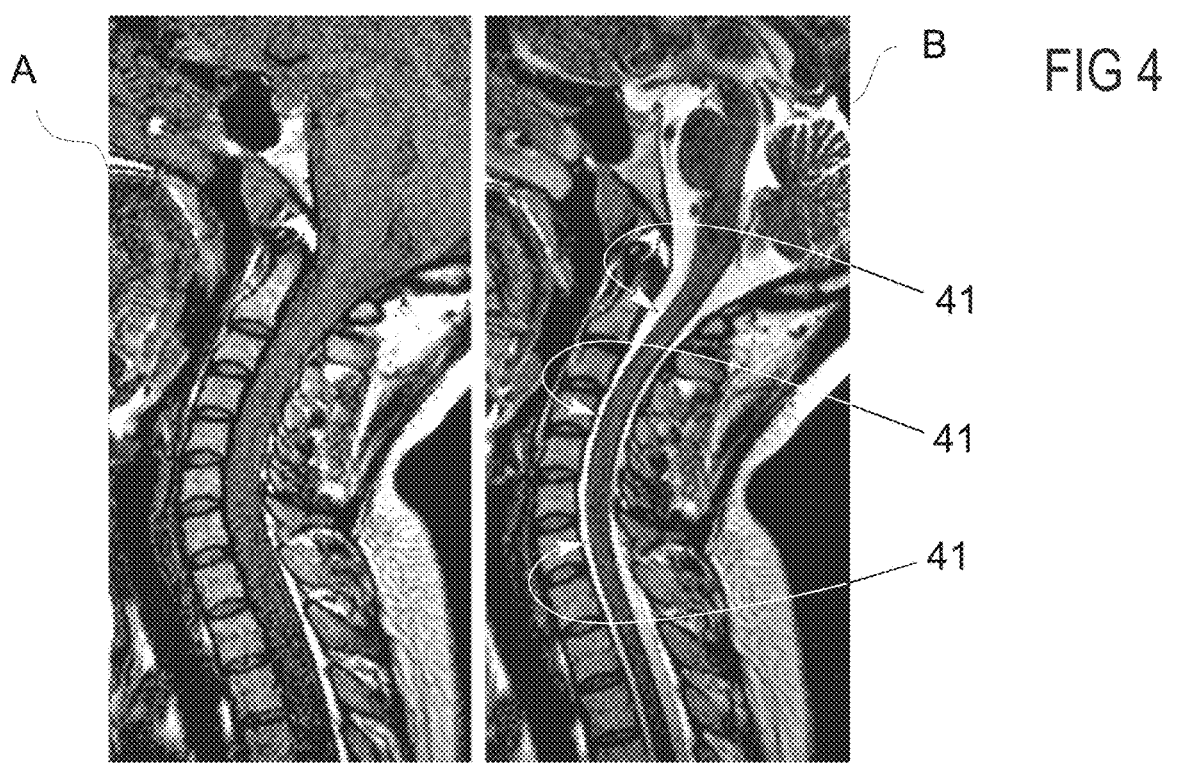
FIG. 4 is an illustration which presents 3D fast/turbo spin-echo images (TR/TE 211/60 ms) acquired without (left image A) and with (right image B) a driven-equilibrium pulse-sequence element appended to the imaging sequence.
FIG. 5 is a schematic representation of a basic STIR-TSE sequence with an unadjusted "driven-equilibrium" pulse-sequence element as shown in FIG. 3(B)
Figure 6A:
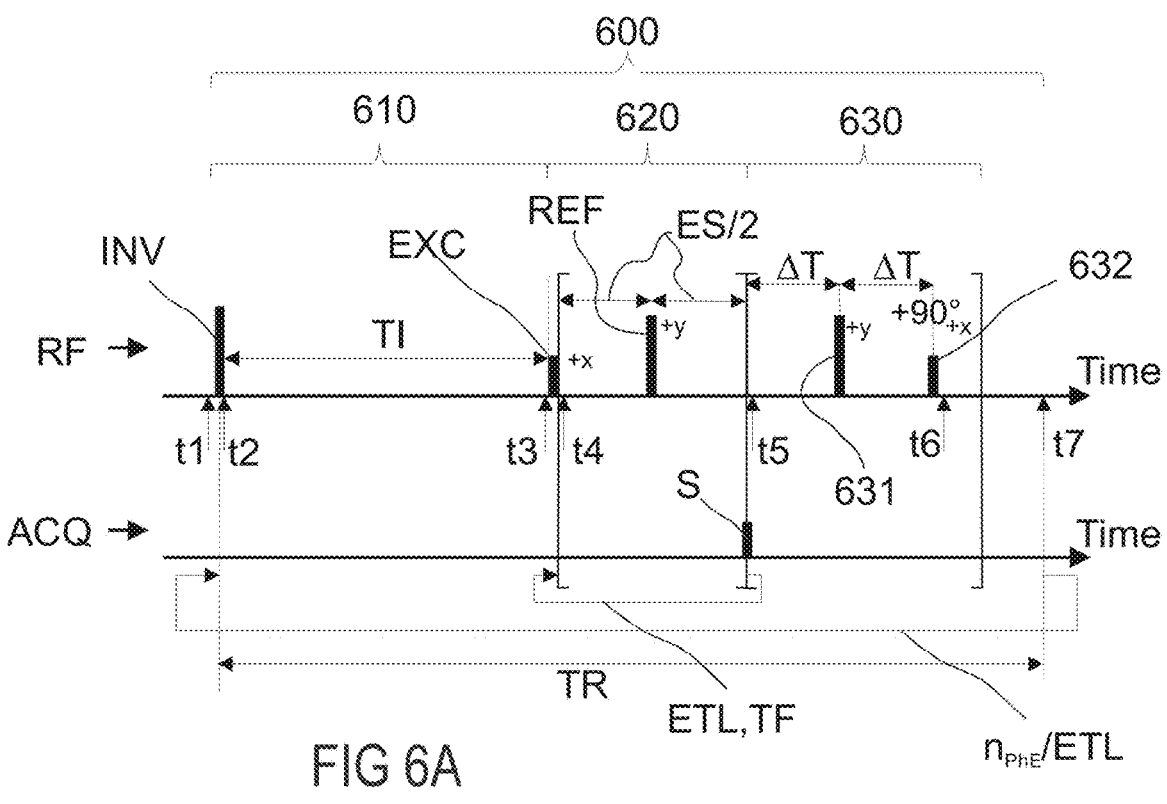
FIG. 6A is a schematic representation of a preferred embodiment of an MRI pulse sequence according to the invention.

Contrary to prior art MRI systems whose MRI pulse sequences have been illustrated by FIGS. 3 and 5, and already discussed in the introduction to the present invention, the MRI system 100 according to the invention is configured for carrying out a novel pulse sequence. A preferred embodiment of the novel pulse sequence is schematically illustrated by FIG. 6A and further characterized by FIG. 6B. Another preferred embodiment of the novel pulse sequence is also schematically illustrated by FIG. 9, wherein the fate of fluid, tissue, and fat magnetization for times t1-t7 is still characterized by FIG. 6B. In order to carry out the method according to the invention, the MRI system 100 may comprise a non-transitory computer-readable medium, e.g. a memory, encoded with instructions that, when executed, cause the axial magnetic field coil controller, the gradient coil controller, the RF coil controller, and the receiver coil controller to cooperate for implementing the method according to the invention for imaging the object 106. The method, which will be now described in more detail with respect to the preferred embodiment of FIGS. 6A and 6B, comprises notably the now described steps.

At step 201, the MRI system 100, for instance its RF coil controller, is configured for performing an MRI pulse sequence 600 wherein the series of pulses repeated for each TR period mimics a composite 0°-pulse for magnetization of interest, typically fluid magnetization with long T1 and T2 values. The MRI pulse sequence 600, which is schematically represented in FIG. 6A for the case of a spin echo sequence and in FIG. 9 for the case of a gradient echo sequence, comprises a series of RF pulses in function of the time. According to the present invention, the MRI pulse sequence 600 comprises three consecutive RF elements, namely a first element 610, a second element 620, and a third element 630. The first element 610 is an inversion-recovery pulse sequence, e.g. a STIR pulse sequence. It comprises a 180° inverting pulse INV. The second element 620 is an image-encoding pulse sequence, e.g. a TSE pulse sequence. It starts with an excitation RF pulse EXC. The time separating the 180° inverting pulse INV and the excitation RF pulse EXC (typically a 90° RF pulse) is the inversion time TI. In the case of FIG. 6A, the excitation RF pulse EXC is then followed by a train of refocusing RF pulses REF, imaging encoding gradients and data sampling(s), as known in the art. The echo spacing ES represents the time between the echoes in the multiple echo sequences of the second element 620, ES/2 (i.e. half the echo spacing time) being the time separating the excitation RF pulse EXC from the refocusing RF pulse REF, the echo train length ETL or turbo factor TF represents the number of echoes during the second element 620, and the number of phase-encoding steps is represented by $n_{PhE}$. In particular, according to the present invention, the minimum number of echoes (ETL or TF) equals 1. The time interval between each repetition of the MRI pulse sequence 600 is the repetition time TR. The signal acquisition ACQ in function of the time is also schematically represented in FIG. 6A, wherein the peak of induced signal S occurs at the time ES/2 after the refocusing RF pulse REF.

Contrary to existing DE modules, the third element 630 is an mDE pulse sequence module in that it ends with a +90° flip-back pulse 632 along the +x axis. In particular, the mDE pulse-sequence module comprises a first RF pulse 631 that is a 180-degree RF pulse applied at a time ΔT after the last echo signal of the echo train (i.e. the time delay or time period separating the first RF pulse 631 and the last echo signal of said echo train is equal to ΔT—as explained afterwards, this will be different for the gradient echo case presented in FIG. 9), and said +90° flip-back pulse 632 is applied at said time ΔT after the first 180-degree RF pulse 631 (i.e. the time delay or time period separating the first RF pulse 631 and said +90° flip-back pulse 632 is also equal to ΔT), i.e. when a spin- or RF-echo of the magnetization of interest occurs, in order to flip back the magnetization of interest back into the positive longitudinal orientation along the positive z-axis. In particular, the time ΔT is minimized, i.e. preferentially tends to 1/2 ES, and preferentially it takes a minimum value equal to 1/2 ES (i.e. ΔT=1/2 ES). This will be better explained when considering FIG. 6B which illustrates the fate of fluid (long T1, long T2), tissue (intermediate T1, intermediate T2, e.g., muscle tissue), and fat (short T1, long "TSE T2") magnetizations through the course of the MRI pulse sequence 600, i.e. in function of the time t1-t7 in FIG. 6A.

As it will be understood by the person skilled in the art, in the present invention, the phase differences between the excitation RF pulse EXC, the refocusing RF pulse REF, and the flip-back pulse 632 are meaningful. In particular, as long as there is a 90° phase difference between the excitation RF pulse EXC (x) and all of the refocusing RF pulses REF (+/−y), then a 90° flip-back pulse with the same phase as the excitation RF pulse EXC (i.e. +x) will be used in said mDE pulse sequence, while in traditional DE, a 180° phase difference between the 90° DE pulse and the 90° excitation RF pulse is used. For instance, if the 90° excitation RF pulse had 180° (−x) phase and the refocusing 180° RF pulse REF had a 90° (+y) phase, then the flip-back pulse would have to be a 90° pulse with a phase of 180° (−x).

Figure 6B:
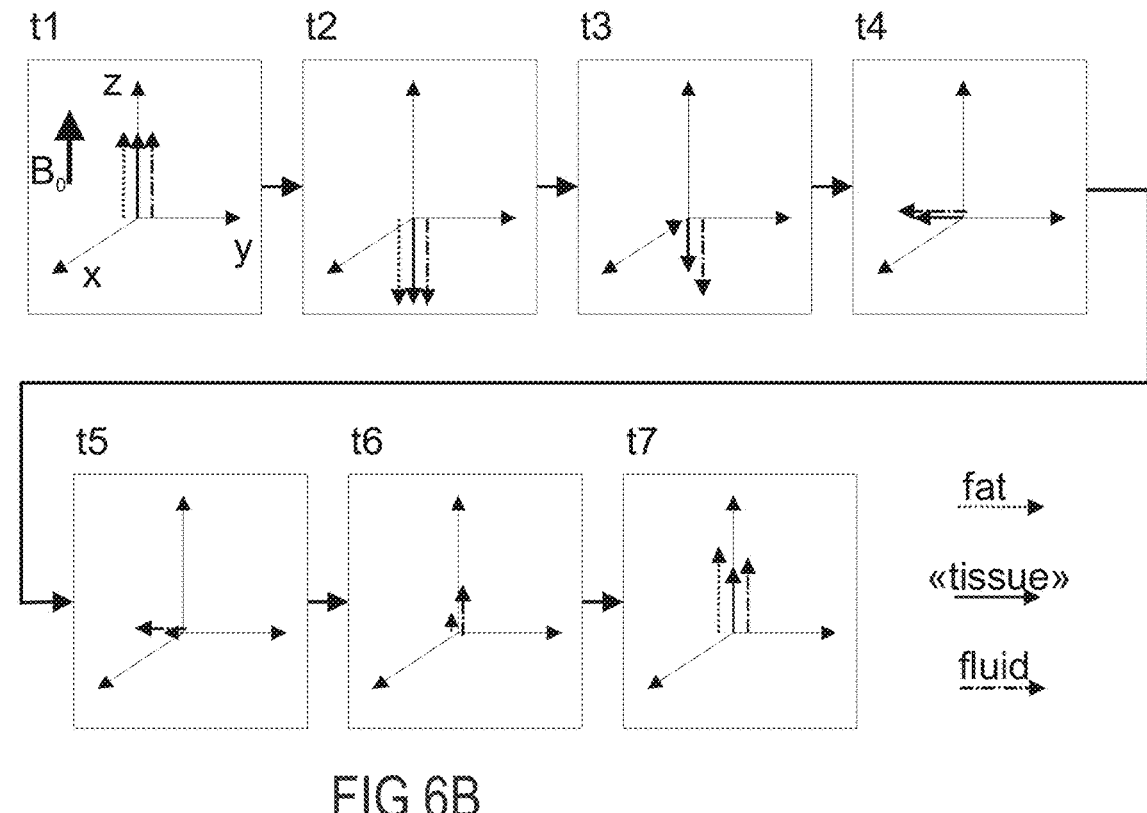
FIG. 6B is a schematic representation of the fate of fluid (dashed dotted line arrow), tissue (straight line arrow), and fat (dotted line arrow) magnetization for times t1-t7 of FIG. 6A.

In FIG. 6B, the temporal evolution of fluid (dashed dotted line arrow), tissue (straight line arrow), and fat (dotted line arrow) magnetization components are schematically represented with respect to a Cartesian coordinate system with reference axes (XYZ), z being aligned with the main static magnetic field B0, the magnetization components being represented for the seven successive different times t1-t7 shown in FIG. 6A.

At time t1, i.e. just before applying the inversion pulse INV, the magnetization components of the fluid, fat, and tissue are each aligned along the z-direction, i.e. in parallel with the main static magnetic field B0. Before application of the very first inversion pulse in the first TR period, this initial longitudinal magnetization corresponds to the magnetization (M0) of all biological material of object 106 in thermodynamic equilibrium. In subsequent TR periods, and depending on the value of TR in relation to the material's T1 times, the magnitude of these magnetizations might be smaller in successive TR periods, until they reach a steady-state value in late TR periods. However, invariably, the longitudinal magnetization component is the one of interest at time t1.

At time t2, i.e. just after applying the inversion pulse INV, the longitudinal magnetization, i.e. the initial magnetization of the fluid, tissue, and fat, is flipped according to a 180-degree angle to point opposite to the direction of the main magnetic field B0, being thus aligned with z-negative.

At time t3, i.e. at the end of the inversion time TI, but before applying the excitation RF pulse EXC, the magnetization components of the tissue, fluid and fat are still aligned with the negative z-axis, but decreased according to T1-relaxation, each at its own rate, giving rise to a fluid magnetization that is greater than the tissue magnetization, the latter being greater than the fat magnetization. By applying the excitation pulse EXC, the longitudinal magnetization is flipped to the XY plane, resulting in transverse magnetization.

At time t4, said transverse magnetization is schematically shown for the fluid, tissue, and fat. As illustrated in the graph, the magnetization of the fat is very small or zero.

During the echo train, T2-relaxation occurs. This is schematically illustrated by the graph for t5, i.e. just after the last echo of the echo train: at this time, and depending on the length of the echo train in relation to the tissues' T2 times, fluid magnetization has the largest magnitude, while the transverse tissue magnetization has decayed to a significant degree, and fat magnetization having almost zero amplitude.

Applying the +90° flip-back pulse 632 according to the invention with the same phase as the excitation pulse EXC results in a conversion of transverse magnetization (graph corresponding to t5) to positive longitudinal magnetization, aligned with B0, illustrated by the graph for t6. Thus, the mDE element generates longitudinal fluid magnetization at time t6 and, consequently, after relaxation between t6 and t7, also at time t7, that has a larger magnitude than it would have in the absence of the mDE element. This is clearly illustrated by a comparison of the magnetization at time t6 in FIG. 5 and at time t6 in FIG. 6B, wherein the +90° flip-back pulse 632 enables converting transverse magnetization into positive longitudinal magnetization, while the traditional DE shown in FIG. 5 converts said magnetization into negative longitudinal magnetization (negative z-axis), which results in an increase of the time required for the longitudinal magnetization associated with the signal of interest to reach a minimum positive value that could allow generation of a minimum signal during the next pulse-sequence shot. At the opposite, the mDE according to the invention enables to shorten the minimally necessary recovery time for the longitudinal magnetization to reach a minimum magnitude, which then allows the generation of a minimum signal during the next pulse-sequence shot. Therefore, the mDE according to the invention enables to increase the signal from tissue of interest instead of decreasing it. For instance, said mDE might ensure that fluid magnetization is flipped back to the positive z-axis at the end of a STIR-prepared turbo-spin echo train, getting therefore a head start for recovery.

Figure 9:
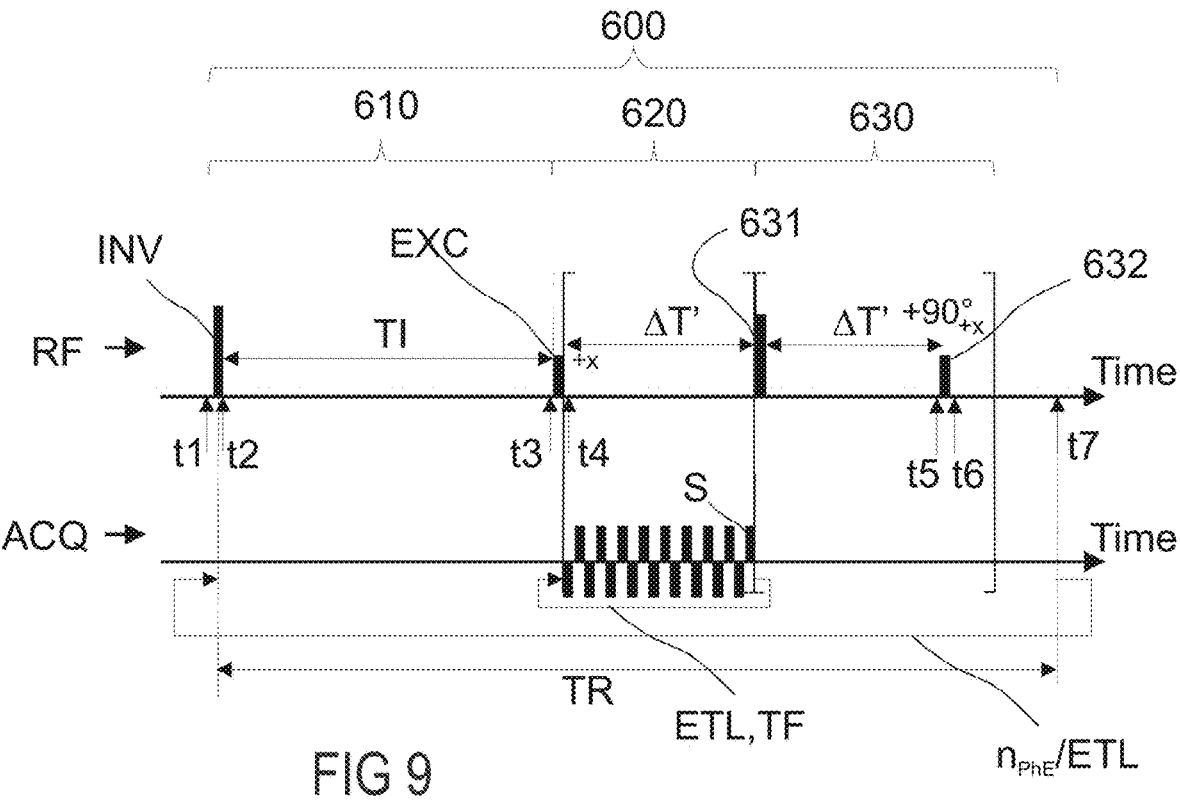
FIG. 9 is a schematic representation of another preferred embodiment of an MRI pulse sequence according to the invention.

FIG. 9 presents another preferred embodiment of said novel pulse sequence according to the invention. In the case of FIG. 9, the spin echo sequence that takes place after the excitation RF pulse EXC in the second element 620 presented in FIG. 6A is replaced by a gradient echo sequence. As already mentioned, the present invention works for an echo sequence containing a single (spin or gradient) echo, as well as an echo sequence containing multiple (spin and/or gradient) echoes. FIG. 9 illustrates the case of multiple gradient echoes comprised within the second element 620, wherein the third element 630 is then configured for refocusing the transverse magnetization and driving its equilibrium. As shown in FIG. 9, the first 180-degree RF pulse 631 is applied at a time ΔT' after the excitation RF pulse EXC, and, as in the case of the spin echo sequence of FIG. 6A, the +90° flip-back pulse 632 is then applied at the time ΔT' after the first 180-degree RF pulse 631. In other words, after acquisition of the last induced signal S (see the signal acquisition ACQ in FIG. 9), the third module 630 starts with said first RF pulse 631 which is temporally located in the middle of the time period separating the time at which the +90° flip-back pulse 632 is applied and the last time at which the magnetization (component) of interest was refocused, which correspond to time t4 in the case of a gradient echo sequence (as illustrated in FIG. 6A, this would correspond to time t5).

At step 202, the MRI system 100 is configured for acquiring an MRI signal generated by the object 106. As known in the art, the MRI signal might be sampled by image readout blocks applied to the object 106 by the MRI system 100 during each repetition time TR.

At step 203, the MRI system 100, or a computing system, is configured for reconstructing an image of the object 106 from the MRI signal, wherein, for the image reconstruction, MRI signal data are typically collected by repeating steps 201 and 202 in loops. Indeed, as known in the art, the MRI system 100, or the computing system, might be configured for repeating steps 201 and 202 for a selected number of TR periods such that a plurality of MRI signals be acquired and then used by the MRI system 100 or computing system for the reconstruction of the image of the object 106.

Figure 7:
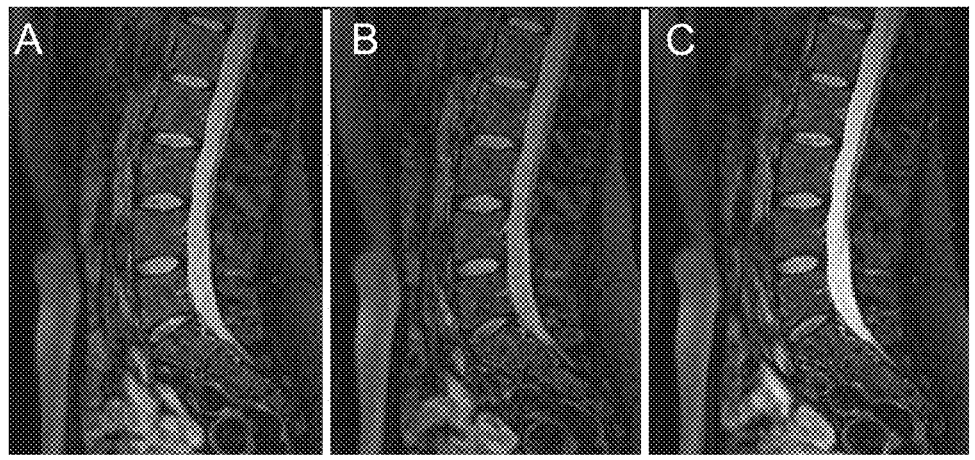
FIG. 7 is an illustration that presents a comparison of 2D STIR images acquired without any DE, and with DE, but with and without the method according to the invention.
Figure 8:
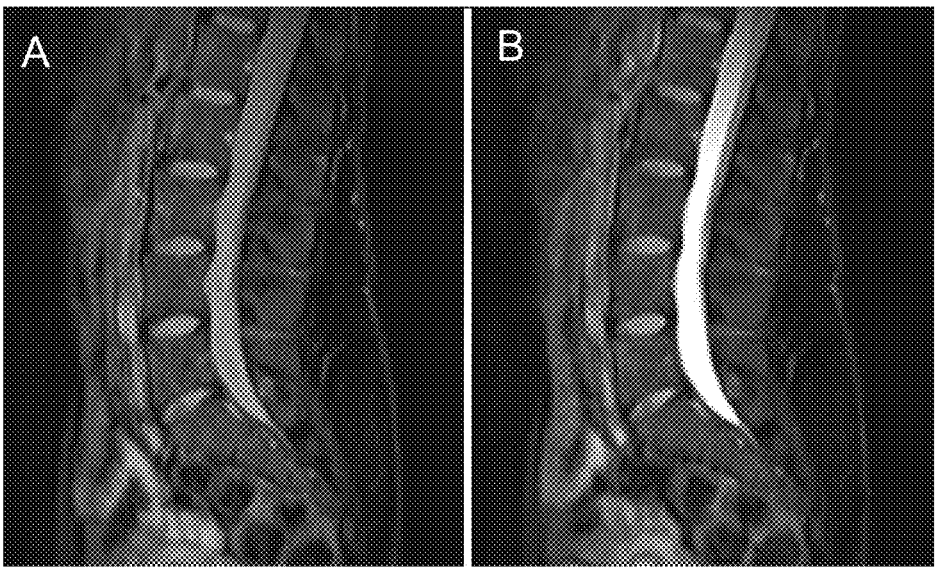
FIG. 8 is an illustration that presents a comparison of 3D STIR images acquired with and without the method according to the invention.

The advantages of the present invention are illustrated by FIGS. 7 and 8, which show examples of the fluid-signal enhancing effect of the MRI pulse sequence 600 according to the invention, in the particular case of 2D and 3D STIR imaging in the lumbar spine. The 2D STIR images of lumbar spine (see FIG. 7) have been acquired at 3 Tesla with unusually short TR time of 2340 ms, without a DE flip-back pulse (A), with a conventional flip-back pulse, optimized for not magnetization-prepared sequences (B), and with mDE according to the invention (C). One can clearly observe a comparatively low signal intensity and brightness of CSF in the spinal canal in image (A), which are even further reduced in image (B) versus a clearly higher signal intensity and brightness in image (C). In particular, to observe at least 95% of the maximum fluid signal in STIR imaging without driven equilibrium, a TR time that is at least 3 times as long as the T1 time of the fluid magnetization would be desirable, i.e., certainly more than ca. 3.5 seconds, but this is often too long in clinical applications and a compromise that trades a smaller signal for a shorter TR time is often sought.

FIG. 8 shows 3D STIR images of a lumbar spine, acquired at 3 Tesla with an even shorter TR time of 1500 ms, without a driven-equilibrium flip-back pulse (A) and with the mDE according to the invention (B). Again, a clearly higher signal intensity of the cerebrospinal fluid can be observed in image (B) compared to image (A).

To conclude, the method according to the invention enables to improve the MRI signal from said magnetization of interest, i.e. generated by the magnetization of interest. In order to achieve said improvement, a new MRI pulse sequence 600 containing a mDE has been proposed, the latter being particularly suitable for fluid imaging, providing a clear enhancement of the fluid signal when using short TR times to accelerate the image acquisition. This is particularly beneficial for 3D-STIR imaging, where the inversion preparation and the data-acquiring TSE pulse train cannot be interleaved, as is possible in 2D-STIR imaging. Nevertheless, the invention may also allow faster 2D STIR imaging, while still providing a good fluid sensitivity, especially when a small number of 2D slices are measured. 3D STIR sequences could be particularly valuable for evaluation of the musculoskeletal system, e.g., to assess inflammation around metallic implants in hip, knee, or shoulder joints.

The following is a summary list of reference numerals and the corresponding structure used in the above description of the invention.

LIST OF CITATIONS

[1] Bydder, G. M. and I. R. Young, *MR imaging: clinical use of the inversion recovery sequence*, J Comput Assist Tomogr, 1985. 9(4): p. 659-675.

[2] Bydder, G. M., J. V. Hajnal, and I. R. Young, *MRI: use of the inversion recovery pulse sequence*. Clin Radiol, 1998. 53(3): p. 159-176.

[3] Pravatä, E., et al., *Dedicated 3D-T2-STIR-ZOOMit Imaging Improves Demyelinating Lesion Detection in the Anterior Visual Pathways of Patients with Multiple Sclerosis*. American Journal of Neuroradiology, 2021. 42(6): p. 1061.

[4] Becker, E. D., J. A. Feretti, and T. C. Farrar, *Driven Equilibrium Fourier Transform Spectroscopy. A New Method for Nuclear Magnetic Resonance Signal Enhancement*. Journal of the American Chemical Society, 1969. 91(27): p. 7784-7785.

[5] Waugh, J. S., *Sensitivity in Fourier transform NMR spectroscopy of slowly relaxing systems*. Journal of Molecular Spectroscopy, 1970. 35(2): p. 298-305.

[6] Waldstein, P. and W. E. W. Jr., *Driven Equilibrium Methods for Enhancement of Nuclear Transients*. Review of Scientific Instruments, 1971. 42(4): p. 437-440.

[7] Wallace, W. E., *Theory and Optimization of the Pulsed NMR Driven Equilibrium Technique*. The Journal of Chemical Physics, 1971. 54(3): p. 1425-1427.

[8] Jones, D. E., *Fourier transform nuclear magnetic resonance. II. Driven equilibrium fourier transform and spin-echo fourier transform*. Journal of Magnetic Resonance (1969), 1972. 6(2): p. 183-190.

[9] Van Uijen, C. M. J. and J. H. Den Boef, *Driven-equilibrium radiofrequency pulses in NMR imaging*. Magnetic Resonance in Medicine, 1984. 1(4): p. 502-507.

[10] Elias R. Melhem, Ryuta Itoh, and Paul J. M. Folkers, Cervical spine: three-dimensional fast spin-echo MR imaging-improved recovery of longitudinal magnetization with driven equilibrium pulse. Radiology, 2001. 218(1): p. 283-8.

The invention claimed is:

1. A magnetic resonance imaging (MRI) method for improving an MRI signal generated by a magnetization of interest when imaging an object placed in an examination volume of an MRI system, the method comprises the steps of:

performing, by the MRI system, an MRI pulse sequence containing three consecutive radio frequency (RF) elements, namely, a first element being an inversion-recovery pulse sequence characterized by a time of inversion), a second element being an image-encoding pulse sequence starting at the time of inversion with an excitation RF pulse followed by at least one image-encoding gradient and at least one data sampling, the second element being followed by a third element, the third element being a modified driven-equilibrium (hereafter "mDE") pulse sequence configured for achieving a conversion of a transverse magnetization component of the magnetization of interest into positive longitudinal magnetization, aligned with positive z-axis and B0-field direction;

acquiring, by the MRI system, an MRI signal generated by the object and sampled by image readout blocks applied to the object by the MRI system during each repetition time; and reconstructing, from the MRI signal, an image of the object.

2. The MRI method according to claim 1, wherein the mDE pulse sequence ends by a phase shifted flip-back pulse characterized by a +90 degree flip angle.

3. The MRI method according to claim 1, wherein the first element is a STIR pulse sequence.

4. The MRI method according to claim 1, wherein the second element contains a single or multiple data samplings.

5. The MRI method according to claim 1, wherein the second element is a sequence configured for generating at least one multiple gradient or spin echo.

6. The MRI method according to claim 1, wherein the second element is a sequence configured for generating a combination of gradient and spin echoes.

7. The MRI method according to claim 1, wherein the second element is a turbo-spin-echo-based pulse sequence.

8. A magnetic resonance imaging (MRI) system, comprising:

a processor configured for carrying out the MRI method according to claim 1.

9. The MRI method according to claim 2, wherein the phase shifted flip-back pulse is characterized by a 90° phase shift relative to a refocusing RF pulse, or non phase shifted relative to the excitation RF pulse, or 180° phase shift relative to a flip-back pulse of a driven-equilibrium pulse sequence.

10. The MRI method according to claim 2, wherein the mDE pulse sequence contains a first RF pulse temporally located in a middle of a time period separating a time at which the +90° phase shifted flip-back pulse is applied and a last time at which a magnetization was refocused.

11. The MRI method according to claim 2, wherein the mDE pulse sequence contains a first RF pulse that is a 180-degree RF pulse applied at a time equal to half an echo spacing after a last echo signal of an echo train, and the +90° flip-back pulse is applied at a time equal to half the echo spacing after the first 180-degree RF pulse.

* * * * *